United States Patent
Hill et al.

(10) Patent No.: US 10,803,892 B1
(45) Date of Patent: Oct. 13, 2020

(54) VOICE COIL MOTOR SATURATION DETECTION

(71) Applicant: Seagate Technology LLC, Cupertino, CA (US)

(72) Inventors: Christopher L. Hill, Apple Valley, MN (US); Josiah N. Wernow, Minneapolis, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/585,070

(22) Filed: Sep. 27, 2019

(51) Int. Cl.
| | |
|---|---|
| G11B 5/54 | (2006.01) |
| G11B 5/55 | (2006.01) |
| G11B 5/596 | (2006.01) |
| H03F 3/20 | (2006.01) |
| H02P 25/034 | (2016.01) |
| H02P 25/022 | (2016.01) |

(52) U.S. Cl.
CPC ........ *G11B 5/5547* (2013.01); *G11B 5/59605* (2013.01); *H02P 25/022* (2013.01); *H02P 25/034* (2016.02); *H03F 3/20* (2013.01)

(58) Field of Classification Search
CPC ... G11B 5/5547; G11B 5/5534; G11B 5/5565; G11B 5/54; G11B 5/55; G11B 5/5521; G11B 5/5586; G11B 5/59627; G11B 5/5556
USPC .......... 360/75, 65, 69, 78.14, 78.04, 78.05, 360/78.13
See application file for complete search history.

(56) References Cited

U.S. PATENT DOCUMENTS

| | | | |
|---|---|---|---|
| 6,757,129 B2 | 6/2004 | Kuroiwa et al. | |
| 6,930,853 B2 | 8/2005 | Settje et al. | |
| 7,068,455 B2 * | 6/2006 | Tanner | G11B 5/5526 360/69 |
| 7,184,235 B2 * | 2/2007 | Jensen | G11B 19/02 360/55 |
| 7,369,350 B2 | 5/2008 | Yang | |
| 8,295,013 B1 | 10/2012 | Pan et al. | |
| 9,251,839 B1 * | 2/2016 | Agness | G11B 19/2081 |
| 10,008,227 B1 * | 6/2018 | Sudo | G11B 5/5534 |
| 10,109,308 B1 * | 10/2018 | Johnson | G11B 21/106 |
| 2008/0030267 A1 * | 2/2008 | Yang | H03F 1/26 330/10 |

* cited by examiner

*Primary Examiner* — Nabil Z Hindi
(74) *Attorney, Agent, or Firm* — Faegre Drinker Biddle & Reath LLP

(57) ABSTRACT

A method includes monitoring an amount of power of a power supply being used by a voice-coil motor (VMC) during a seek operation, detecting that the amount of power has crossed a threshold during the seek operation, and modifying a subsequent seek operation in response to detecting that the amount of power has crossed the threshold.

20 Claims, 4 Drawing Sheets

VOICE COIL MOTOR SATURATION DETECTION

SUMMARY

In certain embodiments, a method includes monitoring an amount of power of a power supply being used by a voice-coil motor (VCM) during a seek operation, detecting that the amount of power has crossed a threshold during the seek operation, and modifying a subsequent seek operation in response to detecting that the amount of power has crossed the threshold.

In certain embodiments, a data storage device includes a VCM assembly and a power supply electrically coupled to the VCM assembly to direct current to the VCM assembly. The power supply includes circuitry configured to monitor an amount of power being used during a seek operation, to detect that the amount of power has crossed a threshold during the seek operation, and to trigger a warning signal in response to the crossed threshold.

In certain embodiments, an integrated circuit includes an amplifier and circuitry. The circuitry is configured to monitor an amount of power from the amplifier being used during a seek operation, to detect that the amount of power has crossed a threshold during the seek operation, and to trigger a warning signal in response to the crossed threshold.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
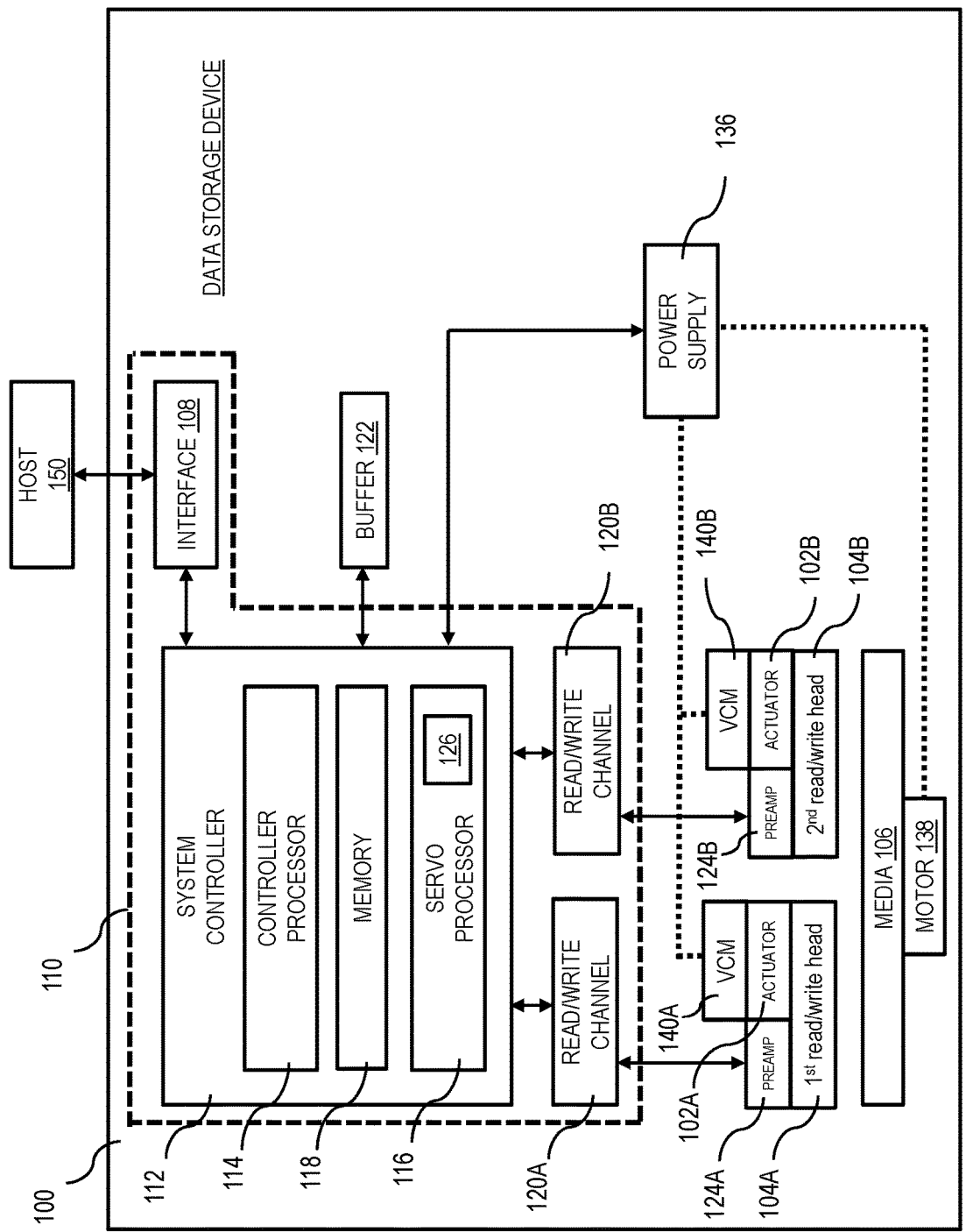
FIG. 1 shows a block diagram of a data storage device, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Data storage devices such as hard disk drives use control systems to position actuators so that read/write heads coupled to the actuators are positioned above desired tracks for carrying out reading and writing operations. For example, control systems may manage the amount of current supplied to voice coil motor (VCM) assemblies, which position the actuators, from a power supply. In certain situations, the control system requests more current than the power supply can provide. When the power supply's limit is reached, the power supply is said to saturate. When saturated, the power supply is unable to supply the requested current to the VCM assemblies, which results in discontinuous or non-linear current that causes errors in positioning the actuators (and therefore positioning the read/write heads). Certain embodiments of the present disclosure are accordingly directed to methods and devices for detecting and mitigating power supply saturation.

FIG. 1 shows a schematic of a data storage device 100 such as a hard disk drive. In the case of a hard disk drive, the data storage device 100 can include multiple actuators (i.e., a first actuator 102A and a second actuator 102B) each with one or more read/write heads 104A and 104B to provide concurrent access to magnetic recording media 106 (e.g., magnetic recording disks, which are referred to as a magnetic recording medium in the singular). In certain embodiments, the multiple actuators 102A and 102B share a common pivot axis and are positioned in a stacked arrangement. In such embodiments, the read/write head(s) 104A coupled to the first actuator 102A access different surfaces of the magnetic recording media 106 than the read/write head(s) 104B coupled to the second actuator 102B. In other embodiments, the multiple actuators 102A and 102B have separate pivot axes. In such embodiments, the read/write head(s) 104A coupled to the first actuator 102A can access the same magnetic recording medium 106 as the read/write head(s) 1048 coupled to the second actuator 1028. Although only two actuators for the data storage device 100 are shown in FIG. 1, additional actuators can be incorporated into the data storage device 100 or the data storage device 100 may have only one actuator.

The data storage device 100 includes an interface 108 (e.g., an input/output interface) for transferring data to and from the data storage device 100. For example, the interface 108, among other features, can be communicatively coupled between a host 150 (e.g., a data storage system such as a server or laptop) and the read/write heads 104A and 104B to facilitate communication, using a standardized communication protocol, between the read/write heads 104A and 104B and the host 150.

The data storage device 100 can include a system on a chip ("SOC") 110 (shown in dashed lines) that includes a system controller 112, which can include a controller processor 114 (e.g., a microprocessor), a servo processor 116 (e.g., a microprocessor), and memory 118 coupled to the controller processor 114 and the servo processor 116. The interface 108 may also be part of the SOC 110. The SOC 110 can also include one or more read/write channels 120A and 120B, which encode data associated with write commands and with read commands. The SOC 110 may be an integrated circuit such as an application-specific integrated circuit ("ASIC") and field-programmable gate array ("FPGA") that includes instructions (e.g., in the form of firmware) for carrying out various functions of the data storage device 100. For example, the SOC 110 can include circuitry to control and carry out various aspects of the data storage device 100 as described in more detail below. Although the interface 108, system controller 112, etc., are shown as being part of a single SOC, the components and their functions can be distributed among several integrated circuits. The system controller 112 can be coupled to and control access to a buffer 122, which can temporarily store data associated with read commands and write commands. The buffer 122 can be a volatile memory, such as a dynamic random access memory ("DRAM"), static random access memory ("SRAM"), or other volatile memory.

During operation, the data storage device 100 receives various data transfer commands (e.g., a read command or a write command) from the host 150. Data associated with a write command may be received from the host 150 by the interface 108 and initially stored to the buffer 122. The data is encoded or otherwise processed by respective read/write channels 120A or 120B and eventually stored to the magnetic recording media 106 via one of the read/write heads 104A or 1048 coupled to the respective first actuator 102A or the second actuator 1028. Data associated with a read command may be retrieved from the magnetic recording media 106 and stored in the buffer 122. Such data is then transferred to the host 150 by the interface 108. In certain embodiments, the servo processor 116 controls operations of respective pre-amplifiers 124A and 124B, which provide signals to the respective read/write heads 104A and 1048 for writing magnetic transitions to the magnetic recording media 106 and for receiving signals from the respective read/write heads 104A and 1048 in response to detecting magnetic transitions written to the magnetic recording media 106.

Figure 2:
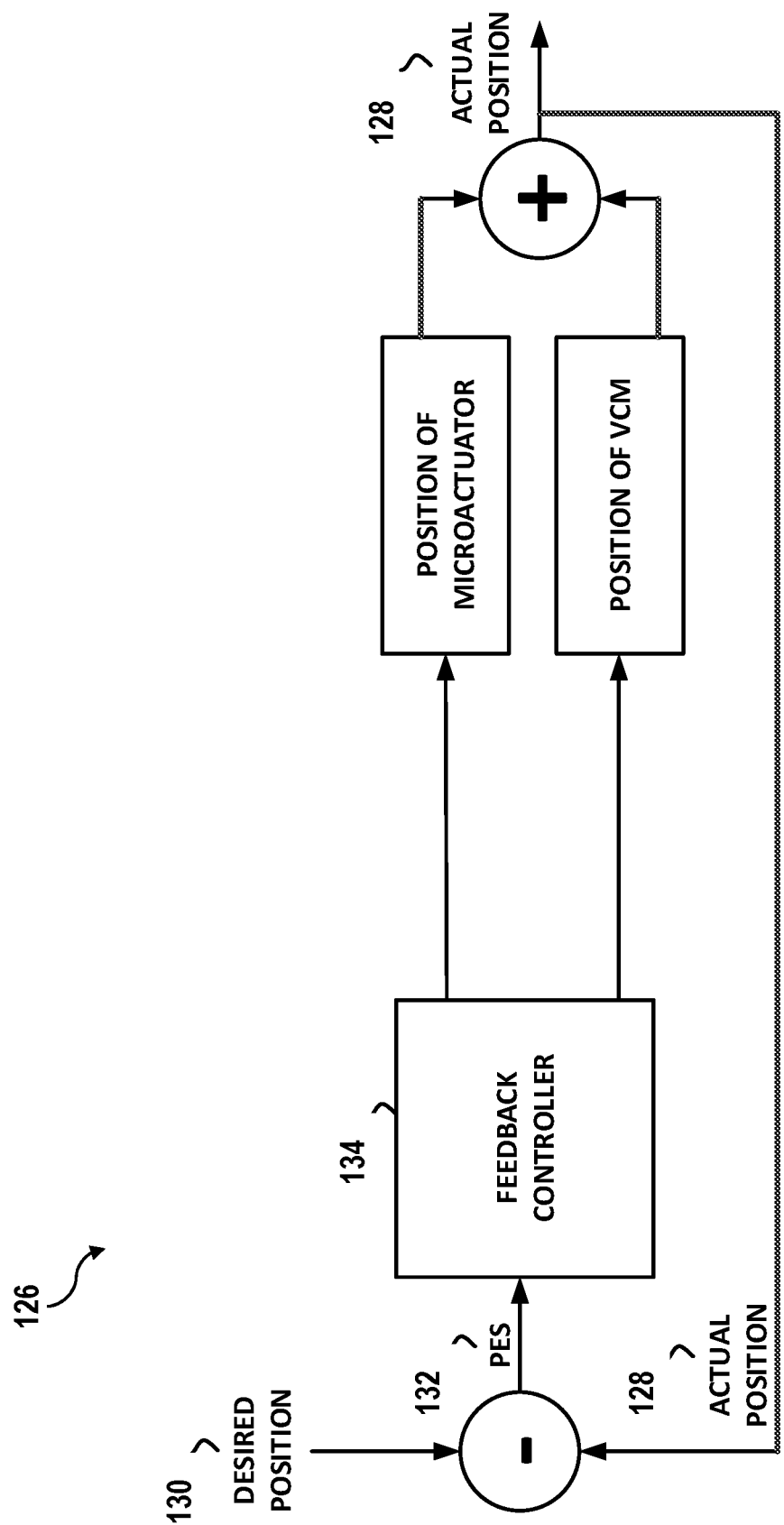
FIG. 2 shows a diagram of a servo control system, in accordance with certain embodiments of the present disclosure.

The data storage device 100 includes a servo control system 126 (schematically shown FIG. 2) that is carried out by components of the system controller 112 (e.g., the servo processor 116 and the memory 118). In operation, the read/write heads 104A and 1048 read the positioning data from servo sectors stored on the magnetic recording media 106. The read positioning data is processed to determine an actual position 128 (shown in FIG. 2) of the read/write heads 104A and 104B relative to tracks on the magnetic recording media 106. The actual position 128 of the read/write heads 104A and 1048 is subtracted from a desired position 130 of the read/write heads 104A and 104B to determine a position error signal (PES) 132, which is the difference between where the read/write heads 104A and 104B are and should be positioned. The PES 132 is fed into a feedback controller 134, which controls current to a VCM assembly and—for some operations—controls voltage to microactuators to position the read/write heads 104A and 1048 over the desired track.

As shown in FIG. 1, the data storage device 100 includes a power supply 136, which is controlled by the system controller 112. The power supply 136 supplies current to a motor 138, which rotates the magnetic recording media 106. The power supply 136 also supplies current to VCM assemblies 140A and 140B. The VCM assemblies 140A and 140B are used to position (e.g., rotate) the actuators 102A and 1026 to position the read/write heads 104A and 1046 over a desired data track on the magnetic recording media 106 for data reading and data writing operations. For example, in response to a command to read data from or write data to a data track located a certain distance away from where a respective read/write head 104A or 1046 is currently positioned (i.e., a track-seeking operation), a current may be supplied by the power supply 136 and applied to the voice coil of the respective VCM assemblies 140A and 140B to rotate the respective actuators 102A and 102B (and therefore the respective read/write heads 104A and 104B) towards the desired data track. The applied current through the coil generates a magnetic field that interacts with magnets of the VCM assemblies 140A and 140B. The applied current may follow a current profile determined by and commanded by the servo processor 116. As the respective read/write heads 104A and 1046 near the desired data track, less current is applied to the VCM assemblies 140A and 1406 such that the read/write heads 104A and 1046 begin to settle over the desired data track (i.e., a track-settling operation). Once the respective read/writes head 104A and 1046 are positioned over the desired data track, the servo control system 126 compensates for small positioning errors (i.e., a track-follow operation) to keep the desired read/write heads 104A and 1046 over the desired data tracks on the magnetic recording medium 106 during a read operation or a write operation.

As mentioned above, during operation, the servo processor 116 determines how much current from the power supply 136 should be provided to the VCM assemblies 140A and 140B to carry out a desired positioning operation. In certain embodiments, the power supply 136 is an integrated circuit, which includes electronics (e.g., voice coil driver electronics) designed to provide current to the VCM assemblies 140A and 140B. For example, the power supply 136 may include a pulse-width-modulated-based current feedback amplifier driver circuit or transconductance amplifier driver circuit (e.g., either of which may comprise class D amplifier circuitry).

During a seek operation, the power supply 136 provides current to the VCM assemblies 140A and 140B according to a programmed profile determined by the servo processor 116. In some situations, the servo processor 116 may request more current than the power supply 136 can provide. When the power supply's limit is reached, the power supply 136 is said to saturate. When saturated, the servo control system's feedback loop becomes non-linear and the power supply 136 supplies current to the VCM assemblies 140A and 140B in a discontinuous or non-linear manner, which causes errors in positioning the actuators 102A and 1028 (and therefore the read/write heads 104A and 104B). For example, the velocity or position of the driven actuator 102A or 1028 may vary from the programmed and desired velocity or position. The supplied current becomes discontinuous while the power supply 136 attempts to recover from saturation or until the commanded current is reduced. For data storage devices with multiple actuators, when one of the actuators 102A or 1028 receives its current in a discontinuous manner, positioning of the other actuator 102A or 1028 can be altered too. For example, if one actuator 102A or 1028 is carrying out a non-linear track seeking operation while the other actuator 102A or 102B is carrying out a data reading or data writing operation, the read/write head 104A or 1048 reading or writing data can have an increase in position error, exceed track limits, or be knocked off track during the reading or writing operation. These effects can degrade performance of the data storage device 100. Saturation can occur throughout the seek operation, but typically occurs near the beginning of a seek operation when the VCM assemblies 140A and 140B require a relatively significant amount of power to accelerate quickly towards a desired data track on the magnetic recording media 106.

In certain embodiments, the data storage device 100 includes circuitry 142 (shown in FIG. 3) to carry out various steps (outlined in a method 200 of FIG. 4) to monitor power use to help mitigate saturation events. Although the description of the circuitry 142 below is described in the context of a pulse-width-modulated (PWM) power supply, similar approaches can be used in non-PWM power supplies (e.g., non-PWM current drivers or voltage drivers). In certain embodiments, the circuitry 142 is included in the power supply 136.

Figure 3:
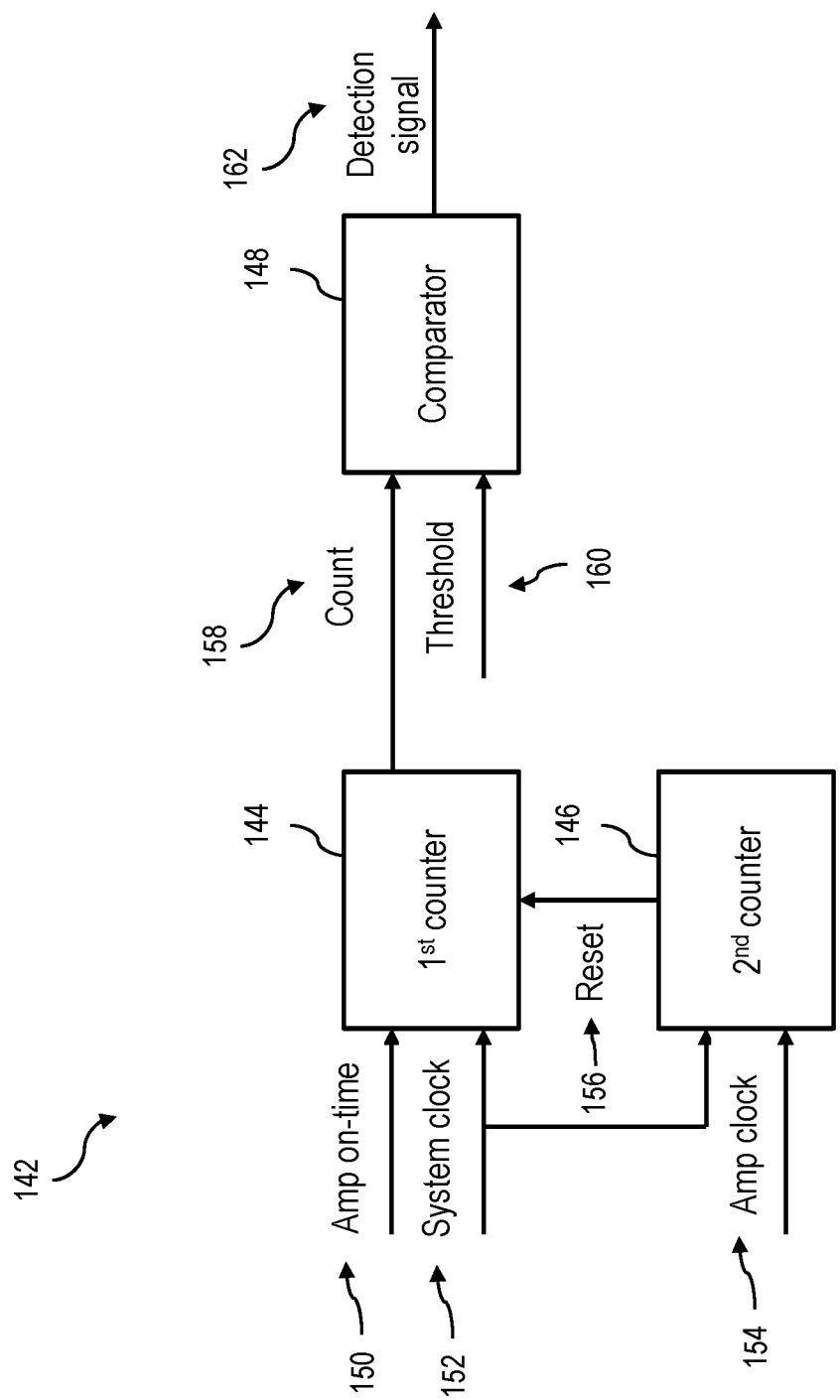
FIG. 3 shows circuitry of a power supply of the data storage device of FIG. 1, in accordance with certain embodiments of the present disclosure.

The circuitry 142 shown in FIG. 3 includes a first counter 144, a second counter 146, and a comparator 148. The first counter 144 counts the number of system clock cycles that the power supply 136 is on. As such, inputs to the first counter 144 include a measure of the on-time 150 of the power supply 136 and the system clock 152.

The second counter 146 counts the number of system clock cycles in one period (e.g., one PWM period) of the power supply 136. As such, inputs to the second counter include the system clock 152 and the clock 154 (e.g., PWM clock) of the power supply 136. The second counter 146 can be communicatively coupled to the first counter 144 such that a reset count signal 156 can be transmitted to the first counter 144. The first counter 144 outputs a count signal 158, which indicates the number of system clock cycles that the power supply 136 is on.

The count signal 158 is inputted to the comparator 148, which compares the count signal 158 to a threshold 160 (e.g., a programmable threshold). If the number of system clock cycles that the power supply 136 is on is greater than the threshold 160, then the comparator 148 can generate a detection signal 162. The detection signal 162 can indicate a warning that the VCM assemblies 140A and 140B are requiring close to the maximum (or a programmable percentage of the maximum) power available from the power supply 136.

Figure 4:
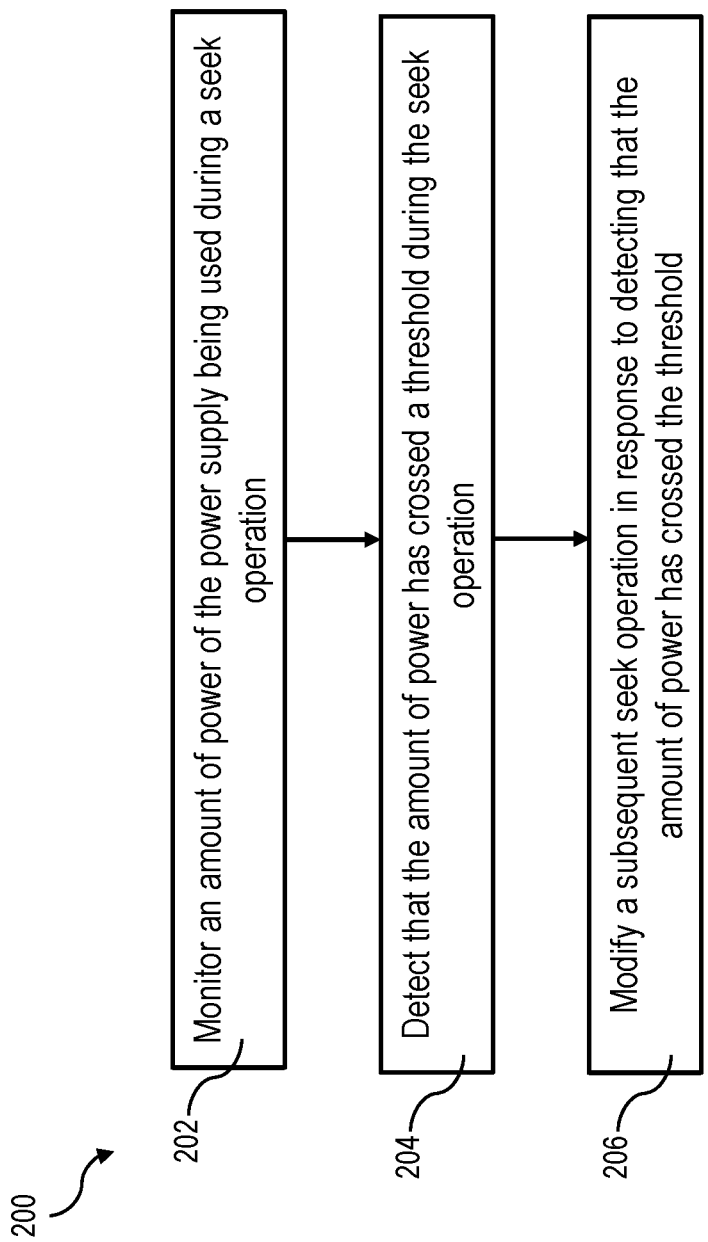
FIG. 4 shows a block diagram of steps of a method, in accordance with certain embodiments of the present disclosure.

FIG. 4 outlines the method 200, which is described in more detail below. The method 200 includes monitoring an amount of power of the power supply 136 being used during a seek operation (block 202 in FIG. 4) to deliver a command current to one or both of the VCM assemblies 140A and 1408. The method 200 also includes detecting the amount of power that has crossed a threshold during the seek operation (block 204 in FIG. 4). Further, the method includes modifying a subsequent seek operation in response to detecting that the amount of power has crossed the threshold (block 206 in FIG. 4).

In certain embodiments, monitoring the amount of power of the power supply 136 being used during a seek operation includes monitoring a percentage of power being used during operation. For PWM-based power supplies, this percentage of power can be monitored by comparing a percentage of power supply on-time as a function of a total PWM period. Put another way, for PWM-based power supplies, the power supply 136 can monitor the number of clock cycles the power supply 136 is on versus the number of clock cycles the power supply 136 is off. The percentage of clock cycles when the power supply 136 is on reflects the percentage of power being used during operation. FIG. 3 shows an example of the circuitry 142 that can be used to monitor the amount of power of the power supply 136 being used during a seek operation.

As referred to above, the monitored amount of power can be compared to a threshold (e.g., by the comparator 148 shown in FIG. 3), and it can be detected when the monitored amount of power crosses the threshold. The threshold can be a predetermined but variable threshold that is set to provide a warning that the VCM assemblies 140A and 140B are requiring close to the maximum (or a programmable percentage of the maximum) power available from the power supply 136. For example, if the power supply 136 is able to supply 0-100% of power, the threshold might be set somewhere at or between 60-95% (e.g., 60%, 65%, 70%, 75%, 80%, 85%, 90%, or 95%). If the threshold was set to 75% and the VCM assemblies 140A and 140B required 80% of the available power of the power supply 136 during a seek operation, then the threshold would be crossed. In the case of a PWM-based power supply, the threshold can be an adjustable duty cycle threshold, while in the case of a linear-mode power supply, the threshold can be an adjustable comparator threshold.

Upon crossing the threshold, the power supply 136 can be programmed to send a signal (e.g., the detection signal 162 in FIG. 3 providing an early warning of saturation) to the system controller 112 (and more particularly, the servo processor 116) so that the system controller 112 is aware that the seek operation required close to 100% of the available power (or a programmable percentage of the maximum power) from the power supply 136. In certain embodiments, a register in the power supply 136 stores the threshold that, when crossed, triggers sending the signal to the system controller 112 via a synchronous serial port signal from the power supply 136.

Upon detecting that the amount of power required for a seek operation has crossed the threshold, subsequent seek operations can be modified. For example, once the system controller 112 receives the signal from the power supply 136, the system controller 112 can calibrate the servo control system 126 such that the amount (e.g., maximum amount) of current commanded by, or otherwise available to, the system controller 112 is modified to reduce the risk of a saturation event while maintaining high performance. The amount of current can be modified, for example, by adjusting servo loop gains, adjusting plant gains, and/or adjusting a scaler used by the servo control system that gets set at the beginning of a seek operation.

By monitoring the power supply's power use relative to its available power, the data storage device 100 can mitigate the risk of the power supply 136 saturating while still obtaining high performance. As described above, mitigating saturation events leads to fewer errors and improves performance of the data storage device 100.

In certain embodiments, the threshold is set at a programmable percentage of maximum current (or maximum amount of power from the power supply 136) such that shorter seek operations can trigger the threshold and therefore the seek parameters can be re-calibrated. With such approaches, shorter seek operations can trigger calibration without needing to wait for a long, maximum current seek operation to initiate calibration.

Various modifications and additions can be made to the embodiments disclosed without departing from the scope of this disclosure. For example, while the embodiments described above refer to particular features (e.g., data storage devices with dual actuators), the scope of this disclosure also includes embodiments having different combinations of features (e.g., data storage devices with a single actuator, three actuators, or four actuators and the like) and embodiments that do not include all of the described features. Accordingly, the scope of the present disclosure is intended to include all such alternatives, modifications, and variations as falling within the scope of the claims, together with all equivalents thereof.

We claim:
1. A method comprising:
monitoring an amount of power of a power supply being used by a voice-coil motor (VCM) during a seek operation, wherein the monitoring the amount of power of the power supply includes monitoring a percentage of power being used during the seek operation;
detecting that the amount of power has crossed a threshold during the seek operation; and
modifying a subsequent seek operation in response to detecting that the amount of power has crossed the threshold.
2. The method of claim 1, wherein the modifying the subsequent seek operation reduces the risk of a saturation event during the subsequent seek operation.

3. The method of claim 1, wherein the percentage of power is determined by comparing a percentage of power supply on-time as a function of a total duty cycle.

4. The method of claim 1, wherein the percentage of power is determined by comparing a number of clock cycles the power supply is on versus a number of clock cycles the power supply is off.

5. The method of claim 1, wherein the modifying the subsequent seek operation includes modifying parameters of a servo control system.

6. The method of claim 5, wherein the parameters include a gain or scaler used by the servo control system.

7. A data storage device comprising:
a voice coil motor (VCM) assembly; and
a power supply electrically coupled to the VCM assembly to direct current to the VCM assembly, the power supply including circuitry configured to monitor an amount of power being used during a seek operation, to detect that the amount of power has crossed a threshold during the seek operation, and to trigger a warning signal in response to the crossed threshold, wherein the threshold is stored in a register of the power supply.

8. The data storage device of claim 7, further comprising: an integrated circuit configured to receive the warning signal and to recalibrate parameters of a servo control system.

9. The data storage device of claim 7, wherein the circuitry is configured to monitor the amount of power of the power supply by monitoring a percentage of power being used during the seek operation.

10. The data storage device of claim 9, wherein the percentage of power is determined by comparing a percentage of power supply on-time as a function of a total duty cycle.

11. The data storage device of claim 9, wherein the percentage of power is determined by comparing a number of clock cycles the power supply is on versus a number of clock cycles the power supply is off.

12. The data storage device of claim 7, wherein the power supply includes an amplifier.

13. The data storage device of claim 12, wherein the amplifier is a pulse-width-modulated amplifier.

14. The data storage device of claim 7, wherein the circuitry includes a counter to monitor the amount of power being used during the seek operation and includes a comparator to detect that the amount of power has crossed the threshold during the seek operation.

15. An integrated circuit comprising:
an amplifier; and
circuitry configured to:
monitor, via a first counter, an amount of power from the amplifier being used during a seek operation,
detect that the amount of power has crossed a threshold during the seek operation, and
trigger a warning signal in response to the crossed threshold.

16. The integrated circuit of claim 15, wherein the circuitry includes a comparator communicatively coupled to the first counter to detect that the amount of power has crossed the threshold during the seek operation.

17. The integrated circuit of claim 15, wherein the circuitry includes a second counter communicatively coupled to the first counter to reset a timer of the first counter.

18. The integrated circuit of claim 15, wherein the circuitry is configured to monitor the amount of power of the power supply by monitoring a percentage of power being used during the seek operation.

19. The integrated circuit of claim 18, wherein the percentage of power is determined by comparing a percentage of power supply on-time as a function of a total duty cycle.

20. The integrated circuit of claim 15, wherein the threshold is stored in a register of the amplifier.

* * * * *